(12) United States Patent
Takahashi

(10) Patent No.: US 7,678,355 B2
(45) Date of Patent: Mar. 16, 2010

(54) METHOD FOR PRODUCING PEROVSKITE-TYPE COMPLEX OXIDE

(75) Inventor: Koh Takahashi, Tokyo (JP)

(73) Assignee: Universal Entertainment Corporation, Tokyo (JP)

( * ) Notice: Subject to any disclaimer, the term of this patent is extended or adjusted under 35 U.S.C. 154(b) by 76 days.

(21) Appl. No.: 11/629,821

(22) PCT Filed: May 30, 2005

(86) PCT No.: PCT/JP2005/009911

§ 371 (c)(1), (2), (4) Date: Apr. 5, 2007

(87) PCT Pub. No.: WO2006/001154

PCT Pub. Date: Jan. 5, 2006

(65) Prior Publication Data

US 2008/0044328 A1  Feb. 21, 2008

(30) Foreign Application Priority Data

Jun. 24, 2004 (JP) ............................. 2004-186792

(51) Int. Cl.
*B01J 23/00* (2006.01)
(52) U.S. Cl. .................. 423/263; 502/303; 502/302; 502/306; 502/250; 502/251; 430/617; 430/496; 430/533; 510/446; 510/24; 423/700; 423/213.5; 423/386; 423/592.1; 423/594.19
(58) Field of Classification Search ........................ None
See application file for complete search history.

(56) References Cited

U.S. PATENT DOCUMENTS 5,026,945 A * 6/1991 Campbell .................... 585/500

(Continued)

FOREIGN PATENT DOCUMENTS

EP  0395022  *  4/1990

(Continued)

OTHER PUBLICATIONS

Michitaka Ohtaki, [Journal-Electrical Transport Properties and High-Temperature Thermoelectric Performance of (Ca 0.9M0.1)MnO3 (M=Y, La, Ce, Sm, In, Sn, Sb, Pb, Bi), Journal of solid state chemistry, vol. 120, pp. 105-111 published in 1995].*

(Continued)

*Primary Examiner*—Melvin C Mayes
*Assistant Examiner*—Smita Patel
(74) *Attorney, Agent, or Firm*—McGinn IP Law Group, PLLC

(57) ABSTRACT

A method for producing a highly crystalline perovskite-type complex compound is provided that exhibits stably a high Seebeck coefficient and a low electric resistivity even at higher temperatures. A method for producing a complex perovskite-type compound with less environmental load is also provided. The method comprises a step of dissolving a nitrate salt containing a rare earth element, a nitrate salt containing an alkaline earth metal element, a nitrate salt containing manganese, and an organic polymer into a solvent to form a solution, a step of mixing and stirring the solution, a step of preparing a precursor powder from the solution through heating and drying thereof, and a step of calcining the precursor powder in atmosphere.

17 Claims, 1 Drawing Sheet

U.S. PATENT DOCUMENTS

| | | | |
|---|---|---|---|
| 5,114,702 A * | 5/1992 | Pederson et al. | 423/639 |
| 5,204,031 A * | 4/1993 | Watanabe et al. | 264/656 |
| 5,804,334 A * | 9/1998 | Yamamura et al. | 429/218.1 |
| 5,939,354 A * | 8/1999 | Golden | 502/400 |
| 6,482,387 B1 * | 11/2002 | Gulgun et al. | 423/593.1 |
| 6,534,670 B2 * | 3/2003 | Yoshisato | 558/274 |

FOREIGN PATENT DOCUMENTS

| | | |
|---|---|---|
| JP | 06-45496 B | 6/1994 |
| JP | 2002-114519 A | 4/2002 |
| JP | 2003-142742 A | 5/2003 |

OTHER PUBLICATIONS

Chinese Office Action dated Nov. 2, 2007, with English translation.

Jin Kaifeng, et al., "Preparation of La0.67Ca0.33MnOx Thin Film Using Polymer Precursor" Piezoelectrics & Acoustooptics vol. 23, No. 6, 2001.

Michitaka Ohtaki, et al. "Electrical Transport Properties and High-Temperature Thermoelectric Performance of (CA0.9 M0.1) MnO3 (M=Y, La, Ce, Sm, In, Sn, Sb, Pb, Bi)", Journal of Solid State Chemistry 120, Jul. 19, 1995, pp. 105-111.

* cited by examiner

METHOD FOR PRODUCING PEROVSKITE-TYPE COMPLEX OXIDE

TECHNICAL FIELD

The present invention relates to methods for producing perovskite-type complex oxides useful as thermoelectric conversion materials, in particular to methods for producing perovskite-type complex oxides containing rare earth elements, alkaline earth metal elements and manganese.

BACKGROUND ART

Complex perovskite compounds have dielectric properties and/or piezoelectric properties, therefore have been widely utilized for dielectric materials, piezoelectric materials etc., and also have been utilized as materials of thermoelectric conversion elemental devices (hereinafter referred to as "thermoelectric conversion material"). The thermoelectric conversion means the conversion between thermal energy and electric energy through Seebeck effect or Peltier effect. By using of the thermoelectric conversion, it is possible to generate electric power from heat flow using the Seebeck effect or to cause endothermic cooling phenomena by flowing an electric current using Peltier effect. Single element units formed of metals or semiconductors are typically utilized for the thermoelectric conversion elemental devices, their performance indices depend on higher order structures such as crystallinity. Therefore, compounds with less structural defects are required for the thermoelectric conversion materials in order to provide the single element units with higher performance indices.

Examples of the preferable compounds for such thermoelectric conversion materials are Bi—Te, Pb—Te and Si—Ge compounds etc. Among these, Bi—Te and Pb—Te compounds may exhibit excellent thermoelectric properties at around room temperature and moderate temperatures of 300 to 500° C. However, these compounds have poor thermal resistance at higher temperatures, thus are difficult to be used at higher temperatures. Furthermore, there are such problems that these compounds contain expensive rare elements such as Te, Sb and Se, therefore their production costs are likely to be higher and also contain environmental-load elements such as Te, Sb, Se and Pb having an intensive toxicity.

Contrary to this, the thermoelectric conversion materials of oxide ceramics contain no rare elements or environmental-load elements, and have features that the thermal resistance is higher due to less structural defects and the degradation of thermoelectric properties is lower at higher temperatures under prolonged use thereof; accordingly, they are attracting attention as alternate materials of compound semiconductors. Perovskite-type compounds of $CaMnO_3$, for example, are proposed in which 10% of Ca sites are replaced by metal elements such as Bi, La and Ce (see Non-Patent document 1). In addition, inexpensive, thermally stable and less environmental-load cobalt-containing oxides are also attracting attention.

Non-Patent Document 1: Michitaka Ohtaki et. al., Journal of Solid State Chemistry 120, 105-111 (1995)

DISCLOSURE OF THE INVENTION

Problems to be Solved by the Invention

The Non-Patent Document 1 discloses that a partial replacement of Ca sites in $CaMnO_3$, being one of high-resistant n-type semiconductors, into elements with higher atomic values may bring about a significant increase of electric conductivity and the replaced element of Bi may lead to the highest power factor. However, since there is a negative relation between Seebeck coefficient and carrier concentration, increase of the carrier concentration unfavorably decreases the Seebeck coefficient, which limits the attainable performance index. Furthermore, cobalt-containing oxides are unpractical with respect to scale-up and popularization of thermoelectric conversion modules since the main ingredient of Co is expensive.

The present invention has been made in view of the problems described above; it is an object of the present invention to provide a method for producing a highly crystalline perovskite-type complex compound that exhibits stably a high Seebeck coefficient and a low electric resistivity even at higher temperatures. It is another object of the present invention to provide a method for producing a complex perovskite-type compound with less environmental load.

Means for Solving the Problems

The present invention, specifically, provides the following items.

According to a first aspect of a method for producing a perovskite-type complex oxide equipping a step of dissolving a nitrate salt containing a rare earth element, a nitrate salt containing an alkaline earth metal element, a nitrate salt containing manganese and an organic polymer into a solvent to form a solution, a step of mixing and stirring the solution, a step of preparing a precursor powder from the solution through heating and drying thereof, and a step of calcining the precursor powder in atmosphere.

In accordance with the invention in the first aspect, comprising the step of dissolving a nitrate salt containing a rare earth element, a nitrate salt containing an alkaline earth metal element, and a nitrate salt containing manganese into the solvent may make possible to disperse uniformly these solutes into the solvent, thus resulting in uniform reaction. Therefore, oxides with higher crystallinity can be produced than the oxides in the prior art that are produced by mixing powders then reacting them. In addition, the reaction temperature can be lower than that of conventional methods.

According to a second aspect of the method for producing a perovskite-type complex oxide as described in the first aspect of the present invention, further comprises a step of shaping the precursor powder.

In accordance with the second aspect of the present invention, comprising the step of shaping the calcined powder may make possible to be utilized as a thermoelectric conversion material.

According to a third aspect of the method for producing a perovskite-type complex oxide according to the first and the second aspects of the present invention, wherein the perovskite-type complex oxide is expressed by the general formula $Ca_{(1-x)}M_xMnO_3$ (M is yttrium or a lanthanoid, $0.001 \leq x \leq 0.05$).

In accordance with the third aspect of the present invention, the perovskite-type complex oxide of the general formula $Ca_{(1-x)}M_xMnO_3$ (M is yttrium or a lanthanoid, $0.001 \leq x \leq 0.05$) may make possible to improve the thermal resistance still more at higher temperatures.

In accordance with the method for producing the perovskite-type complex oxide according to the present invention, the use of rare earth elements as the substituent element $M_x$ and also the use of Ca and Mn with superior stability at higher temperatures may make possible to achieve higher Seebeck coefficients as well as and lower electrical resistivities. In addition, perovskite-type complex oxides can be produced that exhibit excellent chemical stability at higher temperatures and higher thermoelectric properties stably in atmosphere at higher temperatures.

PREFERRED MODE FOR CARRYING OUT THE INVENTION

Figure 1:
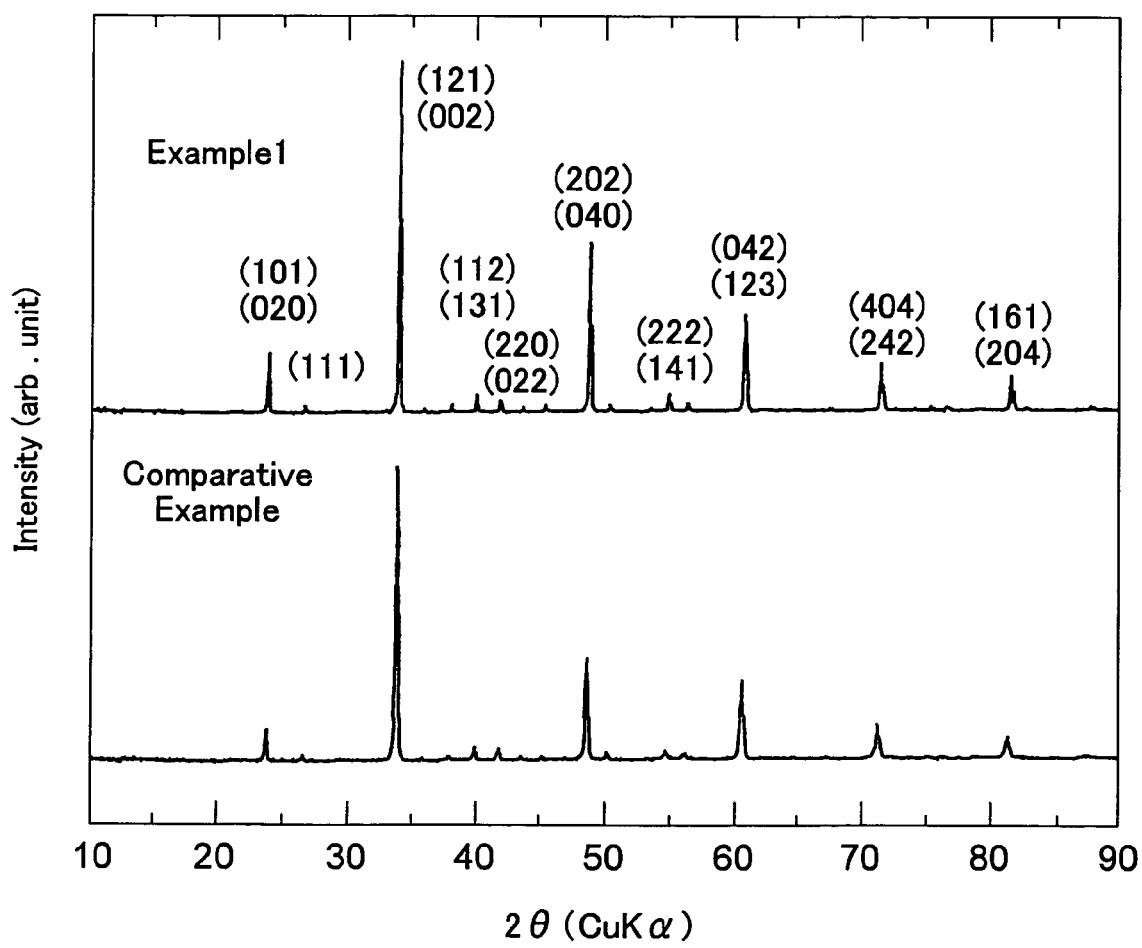
FIG. 1 is a view that shows X ray diffraction patterns of samples in Example 1 and Comparative Example.

The inventive method for producing a perovskite-type complex oxide will be explained in detail below.

The inventive method for producing a perovskite-type complex oxide comprises a step of dissolving a nitrate salt containing a rare earth element, a nitrate salt containing an alkaline earth metal element, a nitrate salt containing manganese, and an organic polymer into a solvent. Examples of the nitrate salt containing a rare earth element include yttrium nitrate tetrahydrate, yttrium nitrate hexahydrate, gadolinium nitrate, gadolinium nitrate hexahydrate, cerium nitrate, cerium nitrate ammonium, lanthanum nitrate etc.; yttrium nitrate tetrahydrate and yttrium nitrate hexahydrate are preferable.

Examples of the nitrate salt containing an alkaline earth metal element include beryllium nitrate, magnesium nitrate, magnesium nitrate hexahydrate, calcium nitrate, calcium nitrate tetrahydrate etc.; calcium nitrate and calcium nitrate tetrahydrate are preferable.

The nitrate salt containing manganese indicates manganese nitrate hexahydrate. The organic polymer indicates water-soluble polymers; specific examples thereof include naturally-occurring starches, gelatins; cellulose derivatives such as semisynthetic carboxymethylcellulose (CMC) and methylcellulose (MC); viscous or coagulable water-soluble polymers such as polyvinyl alcohol (PVA), polyacrylic acid polymers and polyacrylic amide (PAM) and polyethylene oxide (PEO). Preferably, polyvinyl alcohol is utilized. The solvent indicates water, alcohols etc.

The inventive method for producing a perovskite-type complex oxide comprises a step of preparing a precursor powder through heating and drying. The precursor powder indicates a precursor of a perovskite-type complex oxide. The heating and drying is preferably carried out at 150 to 200° C., more preferably 175 to 185° C. The present invention also comprises a step of calcining the precursor powder in atmosphere. A perovskite-type complex oxide is generated through this step. The calcination temperature is preferably 800 to 1300° C., more preferably 1000 to 1200° C. The present invention may further comprise a step of shaping the precursor powder. The shaping may be carried out by such processes as a press shaping, extrusion shaping, slip casting and doctor blade process, preferably by a press shaping. The pressure at the press shaping is preferably 0.5 to 2 t/cm², more preferably 0.8 to 1.2 t/cm² (1 kgf/cm²=9.80665×10⁴ (Pa)).

The perovskite-type complex oxide obtained in accordance with the present invention is a manganese oxide of a composition expressed by $Ca_{(1-x)}M_xMnO_3$. A minute amount of element $M_x$ (substituting element) is an element for introducing a carrier into the manganese oxide. Preferably, $M_x$ is an element of trivalence or higher valence, more preferably a rare-earth element. The value of "x" is preferably no more than 0.05, since the Seebeck coefficient significantly decreases in cases when "x" is higher than 0.05.

Perovskite-type compounds are expressed by a general formula $ABO_3$. Oxygen excess or oxygen deficiency may occur depending on their production conditions, and the oxygen excess or oxygen deficiency is allowable in the present invention. The perovskite-type compounds may have various crystalline structures such as cubic, tetragonal and rhombic systems; any crystal systems are allowable in this invention without limitation. Here, cubic, tetragonal or rhombic system is desirable since the higher is the crystallinity of crystalline structure, the higher is the carrier mobility.

The complex oxides obtained by the inventive method for producing a perovskite-type complex oxide may also be utilized as pyroelectric materials or piezoelectric materials in addition to the thermoelectric conversion materials.

EXAMPLE

Example 1

A total of 0.0975 mol of calcium nitrate, 0.1 mol of manganese nitrate and 0.0025 mol of yttrium nitrate were dissolved into 100 ml of pure water, to which 20 g of polyvinyl alcohol (PVA) aqueous solution of 20% by mass was added and mixed with stirring. The resulting aqueous solution was heated and dried using a dryer at 180° C. to prepare a precursor powder of blackish brown. Thereafter the powder was crushed and then shaped by a uniaxial press at a pressure of 1 t/cm². The shaped body was calcined at 1100° C. for 5 hours in atmosphere to obtain a rod-like cell of a sintered body. The sintered density was 3.11 g/cm³, which was 68% of the theoretical density.

Example 2

A total of 0.099 mol of calcium nitrate, 0.1 mol of manganese nitrate and 0.001 mol of yttrium nitrate were dissolved into 100 ml of pure water, to which 20 g of PVA aqueous solution of 20% by mass was added and mixed with stirring. The resulting aqueous solution was heated and dried using a dryer at 180° C. to prepare a precursor powder of blackish brown. Thereafter the powder was crushed and then shaped by a uniaxial press at a pressure of 1 t/cm². The shaped body was calcined at 1100° C. for 5 hours in atmosphere to obtain a rod-like sintered body. The sintered density was 3.20 g/cm³, which was about 70% of the theoretical density.

Example 3

A total of 0.095 mol of calcium nitrate, 0.1 mol of manganese nitrate and 0.005 mol of yttrium nitrate were dissolved into 100 ml of pure water, to which 20 g of PVA aqueous solution of 20% by mass was added and mixed with stirring. The resulting aqueous solution was heated and dried using a dryer at 180° C. to prepare a precursor powder of blackish brown. Thereafter the powder was crushed and then shaped by a uniaxial press at a pressure of 1 t/cm². The shaped body was calcined at 1100° C. for 5 hours in atmosphere to obtain a rod-like sintered body. The sintered density was 3.05 g/cm³, which was about 66% of the theoretical density.

Example 4

A total of 0.0975 mol of calcium nitrate, 0.1 mol of manganese nitrate and 0.0025 mol of lanthanum nitrate were dissolved into 100 ml of pure water, to which 20 g of PVA aqueous solution of 20% by mass was added and mixed with stirring. The resulting aqueous solution was heated and dried using a dryer at 180° C. to prepare a precursor powder of blackish brown. Thereafter the powder was crushed and then shaped by a uniaxial press at a pressure of 1 t/cm². The shaped body was calcined at 1000° C. for 5 hours in atmosphere to obtain a rod-like sintered body. The sintered density was 3.16 g/cm³, which was about 69% of the theoretical density.

Comparative Example

Calcium carbonate of 0.0975 mol, manganese carbonate of 0.1 mol and yttrium oxide of 0.00125 mol were weighed, and these were mixed with stirring for one hour using an automatic mortar, then preheated at 1000° C. for 10 hours in atmosphere. The resulting preheated powder was crushed and then shaped by a uniaxial press at a pressure of 1 t/cm², which was calcined at 1100° C. for 5 hours in atmosphere to obtain a rod-like sintered body. The sintered density was 3.84 g/cm³, which was about 84% of the theoretical density.

X-ray diffraction patterns are shown in terms of the samples of sintered powders obtained in Example 1 and Comparative Example. The measurement was carried out using an X-ray diffraction apparatus (CuKα ray: λ=1.54 nm, current: 40 mA, voltage: 40 kV). FIG. 1 shows the resulting peaks, which demonstrates that the intensities of the peaks corresponding to (121) (002) face and (202) (040) face of the sample of Example 1 are higher than those of Comparative Example, and crystalline structure of the sample of Example 1 is more uniform than that of Comparative Example from the fact that the peak shape of Example 1 is entirely more sharp.

Sintered bodies were prepared from the samples of Examples 1 to 4 and Comparative Example, and electrodes were formed at both ends of the resulting sintered bodies through coating and baking an Ag paste, then Seebeck coefficients and resistivities were measured. The Seebeck coefficients were derived in such a way that a temperature difference was applied between an upper face and a lower face of a thermoelectric conversion elemental device, and the resulting voltage difference was extrapolated using S=dV/dT (S: Seebeck coefficient, dV: voltage difference between two points, dT: temperature difference between two points). The resistivities were determined by a two-terminal method. The two-terminal method indicates such a method that two electrode terminals are attached to both ends of a sample, the current that flows through the same electrodes and the voltage difference that generates at the time are measure. The results are shown in Table 1. It is demonstrated, from the fact that the sample of Example 1 exhibits the highest thermoelectric conversion efficiency, that the production method according to the present invention can provide perovskite-type complex oxides having higher thermoelectric properties.

TABLE 1

| | Seebeck Cefficient (μV/K) | Resistivity (Ω · cm) | Power Factor (×10−4 W) |
|---|---|---|---|
| Example 1 | −347 | 0.07 | 1.72 |
| Example 2 | −430 | 0.15 | 1.23 |
| Example 3 | −212 | 0.04 | 1.12 |
| Example 4 | −342 | 0.08 | 1.46 |
| Comparative Example | −182 | 0.28 | 1.18 |

Power Factor (×10−4 W/(m · K2)) = (Seebeck Cefficient)2/Resistivity

The invention claimed is:

1. A method for producing a perovskite-type complex oxide, consisting of:
   dissolving a first nitrate salt comprising a rare earth element, a second nitrate salt comprising an alkaline earth metal element, a third nitrate salt comprising manganese, and an organic polymer into a solvent to form a solution;
   mixing and stirring the solution;
   heating and drying said solution to form a precursor powder;
   shaping the precursor powder; and
   calcining the precursor powder in atmosphere to form said perovskite-type complex oxide.

2. The method for producing a perovskite-type complex oxide according to claim 1, wherein said perovskite-type complex oxide comprises a general formula $Ca_{(1-x)}M_xMnO_3$, where M comprises one of yttrium and a lanthanoid and x is in a range from 0.001 to 0.05.

3. The method for producing the perovskite-type complex oxide according to claim 1, wherein said shaping said precursor powder comprises press shaping said precursor powder at a pressure in a range from 0.5 t/cm² to 2.0 t/cm².

4. The method for producing the perovskite-type complex oxide according to claim 1, wherein said calcining the precursor powder is performed at a calcination temperature in a range from 800° C. to 1300° C.

5. The method for producing the perovskite-type complex oxide according to claim 3, wherein said calcining the precursor powder is performed at a calcination temperature in a range from 800° C. to 1300° C.

6. The method for producing the perovskite-type complex oxide according to claim 1, wherein said shaping said precursor powder comprises one of press shaping said precursor powder, extrusion shaping said precursor powder, and slip casting and doctor blade processing said precursor powder.

7. The method for producing the perovskite-type complex oxide according to claim 1, wherein said organic polymer comprises one of a naturally-occurring starch, a naturally-occurring gelatin, semisynthetic carboxymethylcellulose, polyacrylic amide, and polyethylene oxide.

8. A method for producing a perovskite-type complex oxide, consisting of:
   dissolving a first nitrate salt comprising a rare earth element, a second nitrate salt comprising an alkaline earth metal element, a third nitrate salt comprising manganese, and an organic polymer into a solvent to form a solution;
   mixing and stirring the solution;
   heating and drying said solution to form a precursor powder; and
   calcining the precursor powder in atmosphere to form said perovskite-type complex oxide.

9. The method for producing a perovskite-type complex oxide according to claim 8, wherein said perovskite-type complex oxide comprises a general formula $Ca_{(1-x)}M_xMnO_3$, where M comprises one of yttrium and a lanthanoid and x is in a range from 0.001 to 0.05.

10. The method for producing the perovskite-type complex oxide according to claim 8, wherein said calcining the precursor powder is performed at a calcination temperature in a range from 800° C. to 1300° C.

11. The method for producing the perovskite-type complex oxide according to claim 8, wherein said organic polymer comprises one of a naturally-occurring starch, a naturally-occurring gelatin, semisynthetic carboxymethylcellulose, polyacrylic amide, and polyethylene oxide.

12. The method for producing the perovskite-type complex oxide according to claim 8, wherein said heating and drying of said precursor powder is performed at a temperature in a range from 150° C. to 200° C.

13. The method for producing the perovskite-type complex oxide according to claim 1, wherein said second nitrate salt comprises beryllium nitrate.

14. The method for producing the perovskite-type complex oxide according to claim 1, wherein said heating and drying of said precursor powder is performed at a temperature in a range from 150° C. to 200° C.

15. The method for producing the perovskite-type complex oxide according to claim 1, wherein said perovskite-type complex oxide has a sintered density in a range from 66% to 70% of a theoretical density.

16. The method for producing the perovskite-type complex oxide according to claim 8, wherein said second nitrate salt comprises beryllium nitrate.

17. The method for producing the perovskite-type complex oxide according to claim 8, wherein said perovskite-type complex oxide has a sintered density in a range from 66% to 70% of a theoretical density.

* * * * *